United States Patent
Cha et al.

(10) Patent No.: US 12,364,073 B2
(45) Date of Patent: Jul. 15, 2025

(54) UNIT PIXEL HAVING LIGHT EMITTING DEVICE AND DISPLAYING APPARATUS

(71) Applicant: SEOUL VIOSYS CO., LTD., Gyeonggi-do (KR)

(72) Inventors: Namgoo Cha, Gyeonggi-do (KR); Sang Min Kim, Gyeonggi-do (KR); Jae Hee Lim, Gyeonggi-do (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 733 days.

(21) Appl. No.: 17/339,379

(22) Filed: Jun. 4, 2021

(65) Prior Publication Data

US 2021/0384388 A1    Dec. 9, 2021

Related U.S. Application Data

(60) Provisional application No. 63/193,362, filed on May 26, 2021, provisional application No. 63/036,017, filed on Jun. 8, 2020.

(51) Int. Cl.
| | |
|---|---|
| *H10H 20/853* | (2025.01) |
| *H01L 25/075* | (2006.01) |
| *H01L 25/16* | (2023.01) |
| *H10H 20/84* | (2025.01) |
| *H10H 20/855* | (2025.01) |
| *H10H 20/857* | (2025.01) |
| *H10H 29/14* | (2025.01) |

(52) U.S. Cl.
CPC ........ *H10H 20/853* (2025.01); *H10H 20/857* (2025.01); *H10H 29/142* (2025.01)

(58) Field of Classification Search
CPC ......... H01L 33/58; H01L 33/62; H01L 33/22; H01L 25/167; H01L 25/0753; H01L 27/167; H10H 20/853; H10H 29/142
See application file for complete search history.

(56) References Cited

U.S. PATENT DOCUMENTS

| | | | |
|---|---|---|---|
| 2010/0013745 A1* | 1/2010 | Kim | H10K 59/40 345/76 |
| 2010/0148190 A1 | 6/2010 | Kim et al. | |
| 2014/0002770 A1 | 1/2014 | Wang et al. | |
| 2019/0022909 A1 | 1/2019 | Nishimura et al. | |
| 2020/0037442 A1* | 1/2020 | Keum | H05K 1/147 |

(Continued)

FOREIGN PATENT DOCUMENTS

| | | |
|---|---|---|
| EP | 2535954 A1 | 12/2012 |
| EP | 3316301 A1 | 5/2018 |

(Continued)

OTHER PUBLICATIONS

International Search Report for International Application No. PCT/KR2021/007121, mailed Sep. 28, 2021, 3 pages.

(Continued)

*Primary Examiner* — Antonio B Crite
(74) *Attorney, Agent, or Firm* — Perkins Coie LLP

(57) ABSTRACT

A unit pixel according includes a transparent substrate, a plurality of light emitting devices disposed on the transparent substrate, and an adhesive layer disposed between the light emitting devices and the transparent substrate to bond the light emitting devices. The adhesive layer is sealed inside the unit pixel.

16 Claims, 13 Drawing Sheets

(56) References Cited

U.S. PATENT DOCUMENTS

| | | | | |
|---|---|---|---|---|
| 2021/0316535 A1* | 10/2021 | Eguchi | ............. | B32B 17/10761 |
| 2021/0359167 A1* | 11/2021 | Lee | ...................... | H01L 27/156 |
| 2021/0384379 A1* | 12/2021 | Yu | ........................... | H01L 33/58 |
| 2023/0099140 A1* | 3/2023 | Zhong | .............. | G02F 1/133514 |
| | | | | 349/56 |

FOREIGN PATENT DOCUMENTS

| | | | |
|---|---|---|---|
| JP | 2020-080320 A | | 5/2020 |
| JP | 2020-088392 A | | 6/2020 |
| KR | 101676764 B1 | | 11/2016 |
| KR | 20160141362 A | | 12/2016 |
| KR | 1020160141362 A | | 12/2016 |
| KR | 10-2018-0093149 A | | 8/2018 |
| KR | 102109743 B1 | * | 5/2020 |

OTHER PUBLICATIONS

Search Report from corresponding European Patent Application No. 21821040.9, dated Mar. 4, 2024 (9 pages).
Office Action from related corresponding Korean Patent Application No. 10-2022-7039347, dated Apr. 4, 2025, Notice of Reason for Refusal dated Apr. 4, 2025 cited KR-10-2016-0141362 A.

* cited by examiner

UNIT PIXEL HAVING LIGHT EMITTING DEVICE AND DISPLAYING APPARATUS

CROSS-REFERENCE OF RELATED APPLICATIONS AND PRIORITY

The Present Application is a Non-provisional Application which claims priority to and benefit of the filing dates of U.S. Provisional Application Nos. 63/036,017 filed Jun. 8, 2020 and 63/193,362 filed May 26, 2021, the disclosure of which are incorporated herein by reference in their entirety.

TECHNICAL FIELD

Exemplary embodiments relate to a unit pixel having light emitting devices and a displaying apparatus having the same.

BACKGROUND

Light emitting devices are semiconductor devices using light emitting diodes which are inorganic light sources, and are used in various technical fields such as displaying apparatuses, automobile lamps, general lighting, and the like. Light emitting diodes have advantages such as longer lifespan, lower power consumption, and quicker response than conventional light sources, and thus, the light emitting diodes have been replacing the conventional light sources.

The conventional light emitting diodes have been generally used as backlight light sources in displaying apparatuses. However, displaying apparatuses that directly realize images using the light emitting diodes have been recently developed. Such displays are also referred to as micro LED displays.

In general, the displaying apparatus displays various colors through mixture of blue light, green light, and red light. In order to realize various images, the displaying apparatus includes a plurality of pixels, each including blue, green, and red sub-pixels. As such, a color of a certain pixel is typically determined based on the colors of the sub-pixels, and images can be realized through the combination of such pixels.

In the case of the micro LED display, a micro LED is arranged on a two-dimensional plane corresponding to each sub pixel, and, accordingly, a large number of micro LEDs need to be arranged on a single substrate. However, the micro LED is extremely small, for example, 200 µm or less, further 100 µm or less. In particular, it may be difficult to handle the light emitting diodes having small sizes, and thus, it may take considerable effort to directly mount the light emitting diodes on a display panel.

SUMMARY

Exemplary embodiments provide a unit pixel capable of preventing damage or deformation of an adhesive due to an external environment, and a displaying apparatus having the same.

Exemplary embodiments provide a unit pixel including a transparent substrate, a plurality of light emitting devices disposed on the transparent substrate, and an adhesive layer disposed between the light emitting devices and the transparent substrate to bond the light emitting devices. The adhesive layer is sealed inside the unit pixel.

In at least one variant, the adhesive layer may have a smaller area than that of the transparent substrate.

Moreover, the unit pixel may further include a step adjustment layer covering the adhesive layer and the light emitting devices, and the step adjustment layer may cover a side surface of the adhesive layer.

Additionally or alternatively, the unit pixel may further include a protection insulation layer disposed between the step adjustment layer and the adhesive layer, and the protection insulation layer may cover an upper surface and the side surface of the adhesive layer.

In another variant, the protection insulation layer may cover the light emitting devices, and the step adjustment layer and the protection insulation layer may have openings exposing the light emitting devices.

In further another variant, the unit pixel may further include connection layers disposed on the step adjustment layer, and the connection layers may be electrically connected to the light emitting devices through the openings of the step adjustment layer and the protection insulation layer.

In another variant, the unit pixel may further include an insulation material layer covering the connection layers, and the insulation material layer may have openings exposing the connection layers.

In another variant, the insulation material layer may cover side surfaces of the step adjustment layer along with side surfaces of the connection layers.

In another variant, the insulation material layer may have a thickness smaller than that of the step adjustment layer.

In another variant, the unit pixel may further include a light blocking layer disposed between the transparent substrate and the adhesive layer, in which the light blocking layer may have windows through which light generated from the light emitting devices may pass, and the adhesive layer may cover the windows.

In another variant, the unit pixel may further include an etching stop layer disposed between the light blocking layer and the adhesive layer, and the adhesive layer may partially cover the etching stop layer to expose an edge of the etching stop layer.

In another variant, the etching stop layer may be formed in a ring shape along an edge of the transparent substrate, and the windows may be surrounded by the etching stop layer.

In another variant, the unit pixel may further include a step adjustment layer covering the adhesive layer and the light emitting devices, and the step adjustment layer may cover the side surface of the adhesive layer.

In another variant, the unit pixel may further include a protection insulation layer disposed between the step adjustment layer and the adhesive layer, and the protection insulation layer may cover an upper surface and the side surface of the adhesive layer.

In another variant, the protection insulation layer may cover the light emitting devices, and the step adjustment layer and the protection insulation layer may have openings exposing the light emitting devices.

In another variant, a side surface of the transparent substrate may be in flush with side surfaces of the light blocking layer, the etching stop layer, and the protection insulation layer.

A displaying apparatus according to an exemplary embodiment includes a circuit board, and a plurality of unit pixels disposed on the circuit board. Each of the unit pixels includes a transparent substrate, a plurality of light emitting devices disposed on the transparent substrate, and an adhesive layer disposed between the light emitting devices and the transparent substrate to bond the light emitting devices. The adhesive layer is sealed inside the unit pixel.

In at least one variant, the unit pixel may further include a step adjustment layer covering the adhesive layer and the light emitting devices, and a protection insulation layer disposed between the step adjustment layer and the adhesive layer. The step adjustment layer and the protection insulation layer may cover a side surface of the adhesive layer.

In another variant, the unit pixel may further include a light blocking layer disposed between the transparent substrate and the adhesive layer, and an etching stop layer disposed between the light blocking layer and the adhesive layer. The light blocking layer may have windows through which light generated from the light emitting devices may pass, the adhesive layer may cover the windows, and the adhesive layer may partially cover the etching stop layer to expose an edge of the etching stop layer.

In further another variant, the etching stop layer may be formed in a ring shape along an edge of the transparent substrate, and the windows may be surrounded by the etching stop layer.

In some forms, a unit pixel includes a transparent substrate, a plurality of light emitting devices disposed on the transparent substrate, an adhesive layer disposed between the plurality of light emitting devices and the transparent substrate and bonding the light emitting devices to the transparent substrate, and a sealing structure configured to seal the adhesive layer such that the adhesive layer is prevented from moisture damage. The sealing structure further includes a first structure comprising an insulating layer that is resistant to moisture and covering the adhesive layer, and a second structure formed on the first structure, or both.

In another variant, the first structure further includes a protection insulation layer disposed between the second structure and the adhesive layer. The protection insulation layer covers an upper surface and a side surface of the adhesive layer.

In another variant, the second structure further includes a step adjustment layer covering the adhesive layer and the plurality of light emitting devices. The step adjustment layer covers the side surface of the adhesive layer.

The unit pixel further includes a plurality of connection layers disposed on the step adjustment layer and corresponding to the plurality of light emitting devices. Each of the plurality of connection layers is electrically connected to a corresponding light emitting device through the openings of the step adjustment layer and the protection insulation layer.

In some forms, a unit pixel includes a transparent substrate, a plurality of light emitting devices disposed on the transparent substrate, an adhesive layer disposed between the plurality of light emitting devices and the transparent substrate and bonding the light emitting devices to the transparent substrate, and a protection structure configured to protect the adhesive layer. The protection structure further includes a first structure comprising an insulating layer that is resistant to moisture and covering the adhesive layer, a second structure formed on the first structure, and a third structure formed beneath the first structure and exposed around the adhesive layer.

In another variant, the third structure further includes an etching stop layer disposed between the light blocking layer and the adhesive layer. The adhesive layer partially covers the etching stop layer to expose an edge of the etching stop layer.

In another variant, the etching stop layer is formed in a ring shape along an edge of the transparent substrate, and the windows are surrounded by the etching stop layer.

In another variant, the second structure further includes a step adjustment layer covering the adhesive layer and the light emitting devices. The step adjustment layer covers the side surface of the adhesive layer.

In another variant, the first structure further includes a protection insulation layer disposed between the step adjustment layer and the adhesive layer. The protection insulation layer covers an upper surface and the side surface of the adhesive layer.

In some forms, a displaying apparatus includes a circuit board, and a plurality of unit pixels disposed on the circuit board. Each of the unit pixels includes a transparent substrate, a plurality of light emitting devices disposed on the transparent substrate, and an adhesive layer disposed between the light emitting devices and the transparent substrate to bond the light emitting devices. The adhesive layer is sealed inside the unit pixel such that the adhesive layer is inaccessible by moisture. Each of the unit pixels further includes a step adjustment layer covering the adhesive layer and the plurality of light emitting devices, and a protection insulation layer disposed between the step adjustment layer and the adhesive layer. The step adjustment layer and the protection insulation layer cover a side surface of the adhesive layer.

DESCRIPTION OF DRAWINGS

FIG. 5A illustrates forming a concave-convex pattern;

FIG. 5B illustrates forming a light blocking layer on a transparent substrate;

FIG. 5C illustrates forming an adhesive layer on the light blocking layer;

FIG. 5D illustrates selectively removing the adhesive layer;

FIG. 5E illustrates forming a protection insulation layer and a step adjustment layer; and FIG. 5F illustrates forming connection layers on the step adjustment layer.

FIG. 7A illustrates forming a concave-convex pattern;

FIG. 7B illustrates forming a light blocking layer on a transparent substrate;

FIG. 7C illustrates forming an etching stop layer and an adhesive layer;

FIG. 7D illustrates selectively forming the adhesive layer;

FIG. 7E illustrates forming a protection insulation layer covering the adhesive layer; and FIG. 7F illustrates forming connection layers on the step adjustment layer.

DETAILED DESCRIPTION OF EMBODIMENTS

Figure 1:
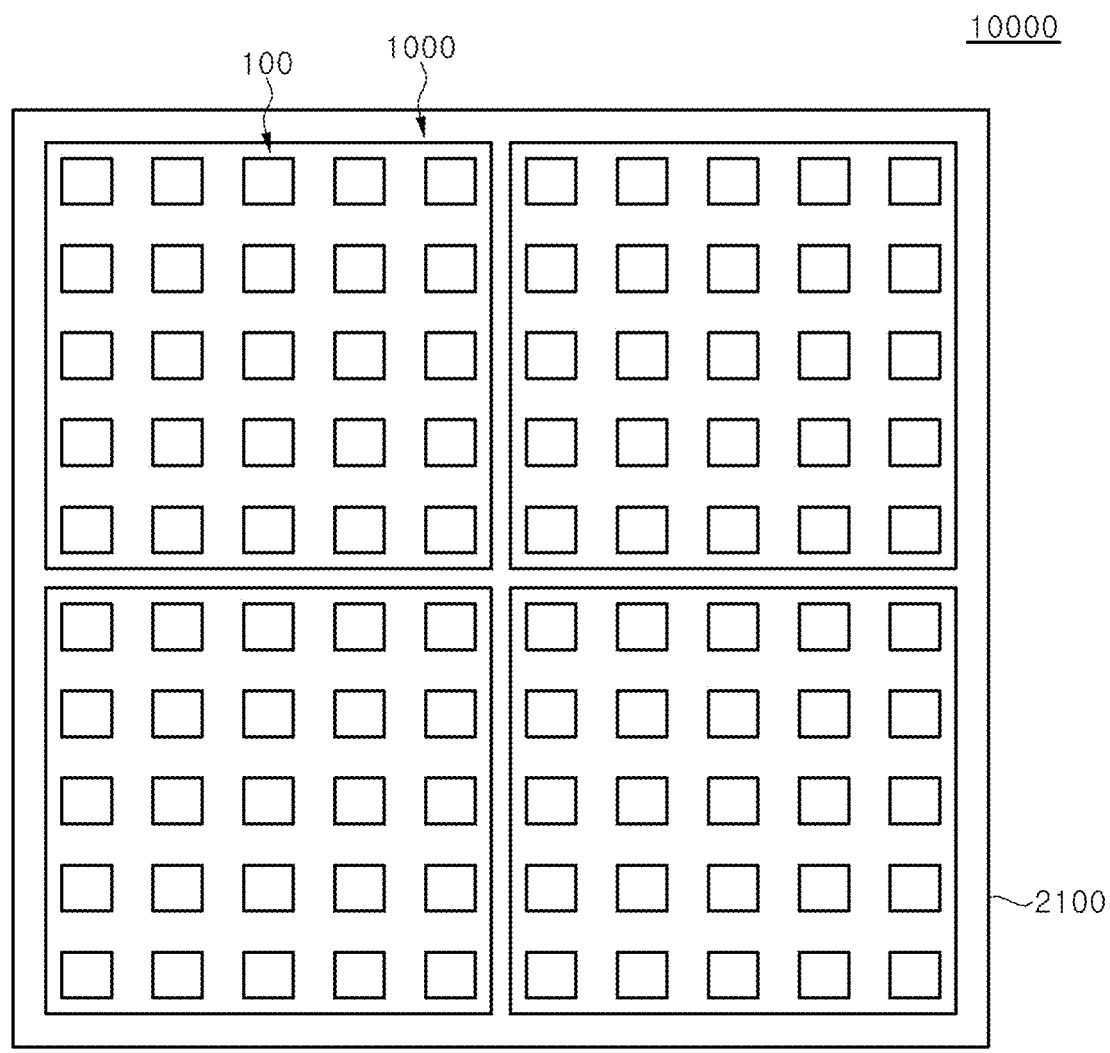
FIG. 1 is a schematic plan view illustrating a displaying apparatus according to an exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

A unit pixel, including sub-pixels, is used to assist mounting micro LEDs. The unit pixel includes light emitting devices attached to a transparent substrate using an adhesive. The unit pixel capable of implementing various colors by using the light emitting devices emitting light of different colors from one another is provided. Light emitted from the light emitting devices is emitted to the outside through the adhesive and the transparent substrate. However, as the adhesive is generally formed of an organic material, it may be damaged or deformed by heat and/or moisture due to an environment in which a micro LED display is used.

Damage or deformation of the adhesive may affect operating performance of the micro LED display. Accordingly, a unit pixel capable of preventing damage or deformation of the adhesive due to an external environment is desirable.

Figure 2:
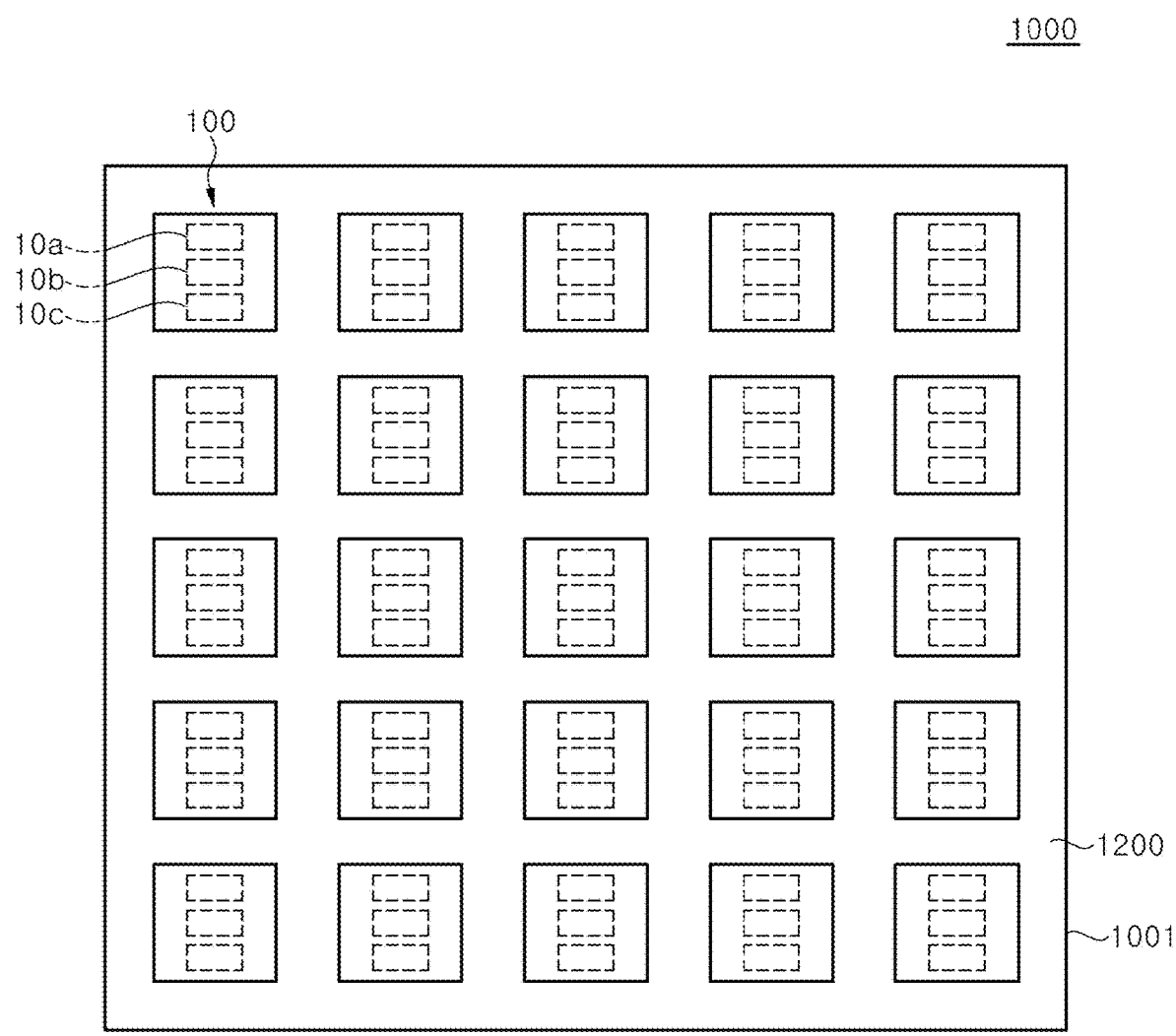
FIG. 2 is a schematic plan view illustrating a pixel module according to an exemplary embodiment.

FIG. 1 is a schematic plan view illustrating a displaying apparatus 10000 according to an exemplary embodiment, and FIG. 2 is a schematic plan view illustrating a pixel module 1000 according to an exemplary embodiment.

Referring to FIG. 1 and FIG. 2, the displaying apparatus 10000 may include a panel substrate 2100 and a plurality of pixel modules 1000.

The displaying apparatus 10000 is not particularly limited, but it may include a VR displaying apparatus such as a micro LED TV, a smart watch, a VR headset, or an AR displaying apparatus such as augmented reality glasses.

The panel substrate 2100 may include a circuit for passive matrix driving or active matrix driving. In an exemplary embodiment, the panel substrate 2100 may include interconnection lines and resistors therein, and in another exemplary embodiment, the panel substrate 2100 may include interconnection lines, transistors, and capacitors. The panel substrate 2100 may also have pads that are capable of being electrically connected to the disposed circuit on an upper surface thereof.

In some forms, the plurality of pixel modules 1000 is arranged on the panel substrate 2100. Each of the pixel modules 1000 may include a circuit board 1001, a plurality of unit pixels 100 disposed on the circuit board 1001, and a molding member 1200 covering the unit pixels 100. In another exemplary embodiment, the plurality of unit pixels 100 may be directly arranged on the panel substrate 2100, and the molding member 1200 may cover the unit pixels 100.

Each of the unit pixels 100 includes a plurality of light emitting devices 10a, 10b, and 10c. The light emitting devices 10a, 10b, and 10c may emit light of different colors from one another. The light emitting devices 10a, 10b, and 10c in each of the unit pixels 100 may be arranged in a line as illustrated in FIG. 1. In some forms, the light emitting devices 10a, 10b, and 10c may be arranged in the vertical direction with respect to a display screen on which an image is implemented. However, the inventive concepts are not limited thereto, and the light emitting devices 10a, 10b, and 10c may be arranged in a lateral direction with respect to the display screen on which the image is implemented in other forms.

It is desirable to avoid directly mounting the light emitting devices 10a, 10b, and 10c on the panel substrate 2100. If mounting may not be properly done, the panel substrate 2100 and all of the light emitting devices may be discarded, resulting in significant cost loss. On the contrary, after the unit pixels 100, on which the light emitting devices 10a, 10b, and 10c are mounted, are manufactured first, favorable unit pixels 100 are selected to be mounted on the panel substrate 2100, and thus, cost loss caused by the failed device may be reduced or avoided.

Hereinafter, each element of the displaying apparatus 10000 will be described in detail in the order of the light emitting devices 10a, 10b, and 10c, the unit pixel 100, and the pixel module 1000 that are disposed in the displaying apparatus 10000.

Figure 3A:
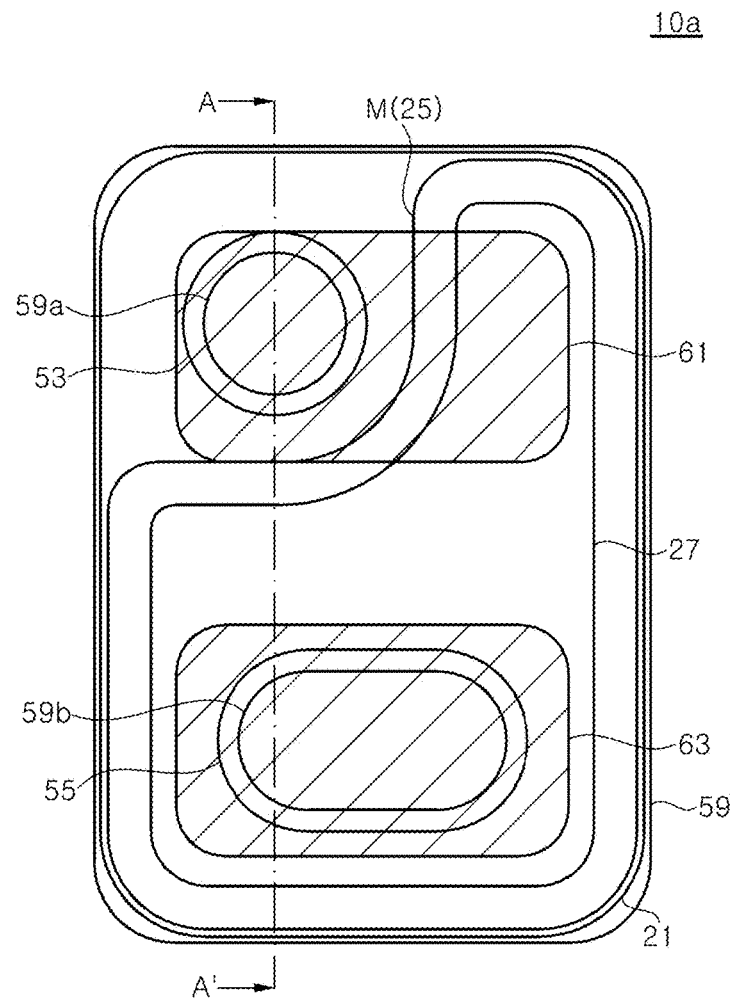
FIG. 3A is a schematic plan view illustrating a light emitting device according to an exemplary embodiment.
Figure 3B:
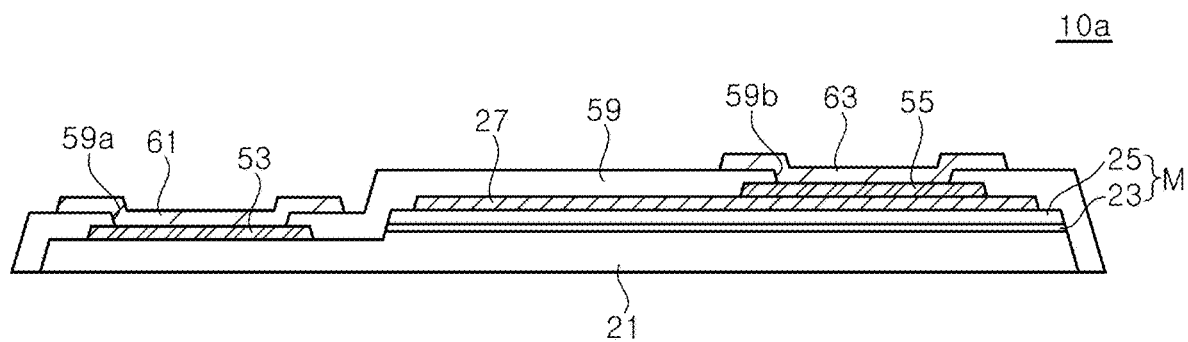
FIG. 3B is a schematic cross-sectional view taken along line A-A' of FIG. 3A.

First, FIG. 3A is a schematic plan view illustrating the light emitting device 10a according to an exemplary embodiment, and FIG. 3B is a schematic cross-sectional view taken along line A-A of FIG. 3A. Herein, although the light emitting device 10a will be described as an example, the light emitting devices 10b and 10c have substantially similar structures and repeated descriptions thereof will be omitted.

Referring to FIG. 3A and FIG. 3B, the light emitting device 10a includes a light emitting structure including a first conductivity type semiconductor layer 21, an active layer 23, and a second conductivity type semiconductor layer 25, an ohmic contact layer 27, a first contact pad 53, a second contact pad 55, an insulation layer 59, a first electrode pad 61, and a second electrode pad 63.

The light emitting device 10a may have a rectangular shape having a long axis and a short axis as viewed in plan view. For example, a length of the long axis may have a size of 100 μm or less, and a length of the short axis may have a size of 70 μm or less. The light emitting devices 10a, 10b, and 10c may have substantially similar shapes and sizes to one another.

The light emitting structure, that is, the first conductivity type semiconductor layer 21, the active layer 23, and the second conductivity type semiconductor layer 25 may be grown on a substrate. The substrate may be one of various substrates that are used to grow semiconductors, such as a gallium nitride substrate, a GaAs substrate, a Si substrate, a sapphire substrate, especially a patterned sapphire substrate. The growth substrate may be separated from the semiconductor layers using a process such as a mechanical grinding, a laser lift off, a chemical lift off process, or the like. However, the inventive concepts are not limited thereto, and, in some exemplary embodiments, a portion of the substrate may remain to constitute at least a portion of the first conductivity type semiconductor layer 21.

When the light emitting device 10a emits red light according to an exemplary embodiment, the semiconductor layers may include aluminum gallium arsenide (AlGaAs), gallium arsenide phosphide (GaAsP), aluminum gallium indium phosphide (AlGaInP), or gallium phosphide (GaP).

When the light emitting device 10b emits green light according to an exemplary embodiment, the semiconductor layers may include indium gallium nitride (InGaN), gallium nitride (GaN), gallium phosphide (GaP), aluminum gallium indium phosphide (AlGaInP), or aluminum gallium phosphide (AlGaP).

When the light emitting device 10c emits blue light according to an exemplary embodiment, the semiconductor layers may include gallium nitride (GaN), indium gallium nitride (InGaN), or zinc selenide (ZnSe).

The first conductivity type and the second conductivity type have opposite polarities, such as the first conductivity type is an n-type and the second conductivity type becomes a p-type, and the first conductivity type is a p-type and the second conductivity type becomes an n-type.

The first conductivity type semiconductor layer 21, the active layer 23, and the second conductivity type semiconductor layer 25 may be grown on the substrate in a chamber using a known process such as metal organic chemical vapor deposition (MOCVD) process. In addition, the first conductivity type semiconductor layer 21 includes n-type impurities (e.g., Si, Ge, and Sn), and the second conductivity type semiconductor layer 25 includes p-type impurities (e.g., Mg, Sr, and Ba). In the case of the light emitting device 10b or 10c emitting green light or blue light, the first conductivity type semiconductor layer 21 may include GaN or AlGaN containing Si as a dopant, and the second conductivity type semiconductor layer 25 may include GaN or AlGaN containing Mg as a dopant.

Although the first conductivity type semiconductor layer 21 and the second conductivity type semiconductor layer 25 are shown as single layers in FIGS. 3A-3B, these layers may be multiple layers, and may also include a superlattice layer. The active layer 23 may include a single quantum well structure or a multiple quantum well structure, and a composition ratio of a compound semiconductor may be adjusted to emit a desired wavelength. For example, the active layer 23 may emit blue light, green light, red light, or ultraviolet light.

The second conductivity type semiconductor layer 25 and the active layer 23 may have a mesa M structure and may be disposed on the first conductivity type semiconductor layer 21. The mesa M may include the second conductivity type semiconductor layer 25 and the active layer 23, and may include a portion of the first conductivity type semiconductor layer 21 as illustrated in FIG. 3B. The mesa M may be disposed on the portion of the first conductivity type semiconductor layer 21, and an upper surface of the first conductivity type semiconductor layer 21 may be exposed around the mesa M.

In the illustrated exemplary embodiment, the mesa M is formed so as to expose the first conductivity type semiconductor layer 21 around it. In another exemplary embodiment, a through hole may be formed through the mesa M to expose the first conductivity type semiconductor layer 21.

In some forms, the first conductivity type semiconductor layer 21 may have a flat light exiting surface. In other forms, the first conductivity type semiconductor layer 21 may have a concave-convex pattern by surface texturing on a side of the light exiting surface. Surface texturing may be carried out by patterning, for example, using a dry or wet etching process. For example, cone-shaped protrusions may be formed on the light exiting surface of the first conductivity type semiconductor layer 21, a height of the cone may be about 2 μm to about 3 μm, a distance between the cones may be about 1.5 μm to about 2 μm, and a diameter of a bottom of the cone may be about 3 μm to about 5 μm. The cone may also be truncated, in which an upper diameter of the cone may be about 2 μm to about 3 μm.

In another exemplary embodiment, the concave-convex pattern may include a first concave-convex pattern and a second concave-convex pattern additionally formed on the first concave-convex pattern.

The concave-convex pattern is formed on the surface of the first conductivity type semiconductor layer 21 such that total internal reflection may be reduced, thereby increasing light extraction efficiency. Surface texturing may be carried out on the first conductivity type semiconductor layers of all of the first, second, and third light emitting devices 10a, 10b, and 10c, and thus, viewing angles of light emitted from the first, second, and third light emitting devices 10a, 10b, and 10c may become uniform. However, the inventive concepts are not limited thereto, and at least one of the light emitting devices 10a, 10b, and 10c may have the flat surface without including the concave-convex pattern.

The ohmic contact layer 27 is disposed on the second conductivity type semiconductor layer 25 to be in ohmic contact with the second conductivity type semiconductor layer 25. The ohmic contact layer 27 may be formed of a single layer or multiple layers, and may be formed of a transparent conductive oxide film or a metal film. For example, the transparent conductive oxide film may include ITO, ZnO, or the like, and the metal film may include a metal such as Al, Ti, Cr, Ni, Au, or the like and alloys thereof.

The first contact pad 53 is disposed on the exposed first conductivity type semiconductor layer 21. The first contact pad 53 may be in ohmic contact with the first conductivity type semiconductor layer 21. For example, the first contact pad 53 may be formed of an ohmic metal layer in ohmic contact with the first conductivity type semiconductor layer 21. The ohmic metal layer of the first contact pad 53 may be appropriately selected depending on a semiconductor material of the first conductivity type semiconductor layer 21. In other forms, the first contact pad 53 may be omitted.

The second contact pad 55 may be disposed on the ohmic contact layer 27. The second contact pad 55 is electrically connected to the ohmic contact layer 27. In other forms, the second contact pad 55 may be omitted.

The insulation layer 59 covers the mesa M, the ohmic contact layer 27, the first contact pad 53, and the second contact pad 55. The insulation layer 59 has openings 59a and 59b exposing the first contact pad 53 and the second contact pad 55. The insulation layer 59 may be formed as a single layer or multiple layers. Furthermore, the insulation layer 59 may include a distributed Bragg reflector in which insulation layers having different refractive indices from one another are stacked. For example, the distributed Bragg reflector may include at least two types of insulation layers selected from $SiO_2$, $Si_3N_4$, SiON, $TiO_2$, $Ta_2O_5$, and $Nb_2O_5$.

The distributed Bragg reflector reflects light emitted from the active layer 23. The distributed Bragg reflector may exhibit high reflectance over a relatively wide wavelength range including a peak wavelength of light emitted from the active layer 23, and may be designed in consideration of an incident angle of light. In an exemplary embodiment, the distributed Bragg reflector may have a higher reflectance for light incident at an incident angle of 0 degrees than that for light incident at a different incident angle. In another exemplary embodiment, the distributed Bragg reflector may have a higher reflectance for light incident at a particular incident angle than that for light incident at the incident angle of 0 degrees. For example, the distributed Bragg reflector may have a higher reflectance for light incident at an incident angle of 10 degrees than thar for light incident at the incident angle of 0 degrees.

Meanwhile, the light emitting structure of the blue light emitting device 10c has higher internal quantum efficiency compared to those of the light emitting structures of the red light emitting device 10a and the green light emitting device 10b. Accordingly, the blue light emitting device 10c may exhibit higher light extraction efficiency than those of the red and green light emitting devices 10a and 10b. As such, it may be difficult to properly maintain a color mixing ratio of red light, green light, and blue light.

To adjust the color mixing ratio of red light, green light, and blue light, the distributed Bragg reflectors applied to the light emitting devices 10a, 10b, and 10c may be formed to have different reflectance from one another. For example, the blue light emitting device 10c may have the distributed Bragg reflector having a relatively low reflectance compared to those of the red and green light emitting devices 10a and 10b. For example, the distributed Bragg reflector formed in the blue light emitting device 10c may have a reflectance of 95% or less at the incident angle of 0 degrees for blue light generated in the active layer 23, and further 90% or less, the distributed Bragg reflector formed in the green light emitting device 10b may have a reflectance of about 95% or more and 99% or less at the incident angle of 0 degrees for green light, and the distributed Bragg reflector formed in the red light emitting device 10a may have a reflectance of 99% or more at the incident angle of 0 degrees for red light.

In an exemplary embodiment, the distributed Bragg reflectors applied to the red, green, and blue light emitting devices 10a, 10b, and 10c may have a substantially similar thickness. For example, a difference in thickness between the distributed Bragg reflectors applied to these light emitting devices 10a, 10b, and 10c may be 10% or less of a thickness of a thickest distributed Bragg reflector. By reducing the thickness difference between the distributed Bragg reflectors, process conditions applied to the red, green, and blue light emitting devices 10a, 10b, and 10c, for example, a process of patterning the insulation layer 59, may be similarly set, and furthermore, it is possible to prevent the unit pixel manufacturing process from becoming complex. Moreover, the distributed Bragg reflectors applied to the red, green, and blue light emitting devices 10a, 10b, and 10c may have a substantially similar stacking number. However, the inventive concepts are not limited thereto.

The first electrode pad 61 and the second electrode pad 63 are disposed on the insulation layer 59. The first electrode pad 61 may extend from an upper region of the first contact pad 53 to an upper region of the mesa M, and the second electrode pad 63 may be disposed in the upper region of the mesa M. The first electrode pad 61 may be connected to the first contact pad 53 through the opening 59a, and the second electrode pad 63 may be electrically connected to the second contact pad 55. The first electrode pad 61 may be directly in ohmic contact with the first conductivity type semiconductor layer 21, and in this case, the first contact pad 53 may be omitted. In addition, when the second contact pad 55 is omitted, the second electrode pad 63 may be directly connected to the ohmic contact layer 27.

The first and/or second electrode pads 61 and 63 may be formed of a single layer or a multiple layer of metal. As a material of the first and/or second electrode pads 61 and 63, a metal such as Al, Ti, Cr, Ni, Au, or the like and an alloy thereof or the like may be used. For example, the first and second electrode pads 61 and 63 may include a Ti layer or a Cr layer at an upper most layer, and may include an Au layer thereunder.

Although the light emitting device 10a according to the exemplary embodiment has been briefly described with reference to FIGS. 3A and 3B, the light emitting device 10a may further include a layer having additional functions in addition to the above-described layers. For example, various layers such as a reflective layer for reflecting light, an additional insulation layer for insulating a specific element, and a solder preventing layer for preventing diffusion of solder may be further included.

When a flip chip type light emitting device is formed, the mesa may be formed to have various shapes, and locations and shapes of the first and second electrode pads 61 and 63 may also be variously modified, and the second contact pad 55 or the second electrode pad 63 may directly contact the second conductivity type semiconductor layer 25.

Figure 4A:
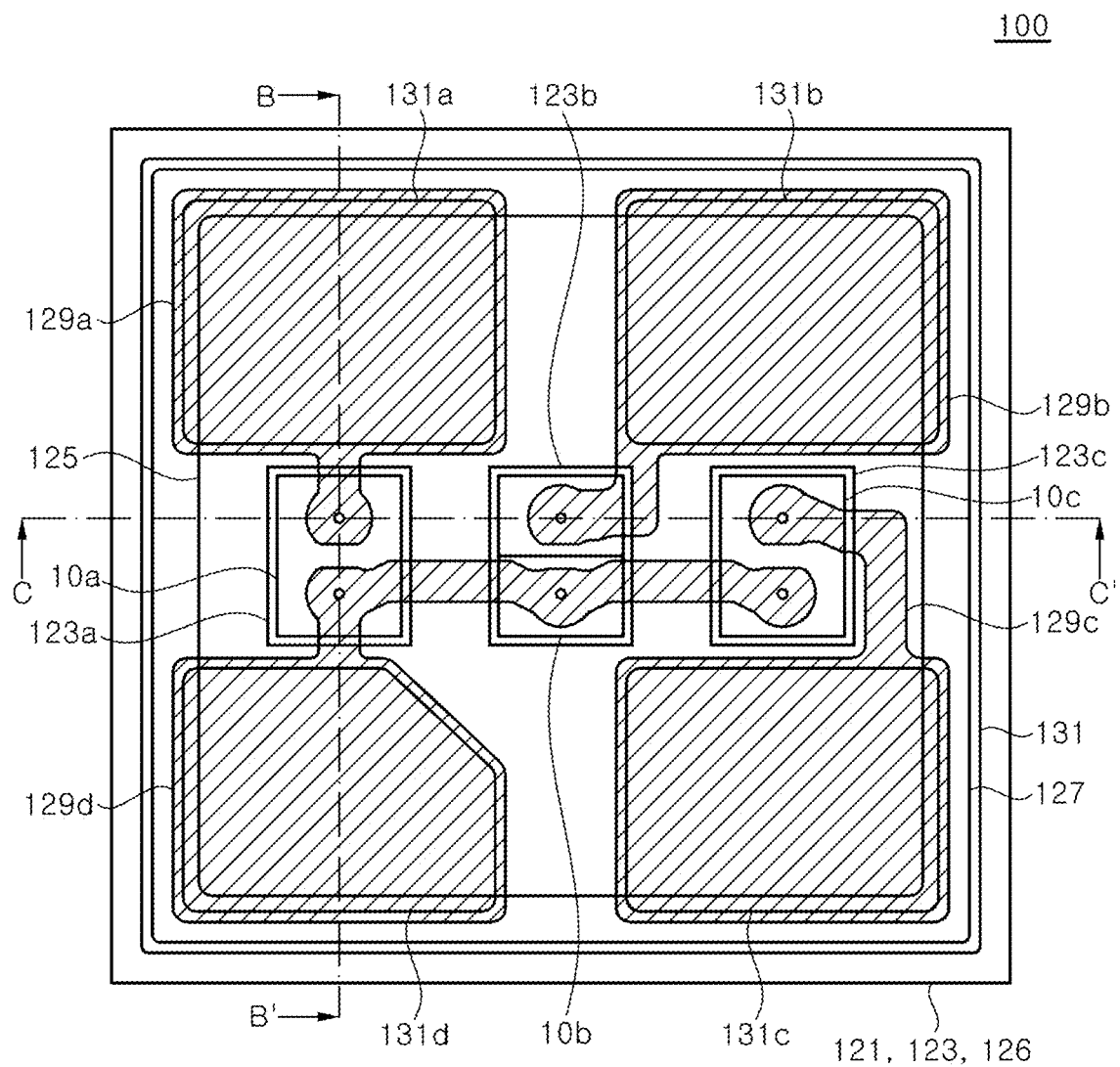
FIG. 4A is a schematic plan view illustrating a unit pixel according to an exemplary embodiment.
Figure 4B:
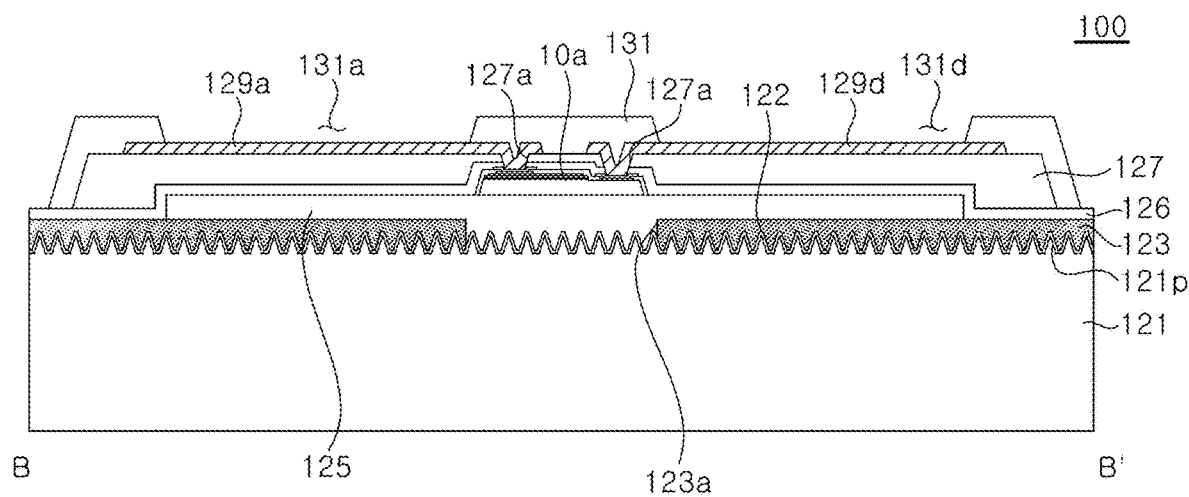
FIG. 4B is a schematic cross-sectional view taken along line B-B' of FIG. 4A.
Figure 4C:
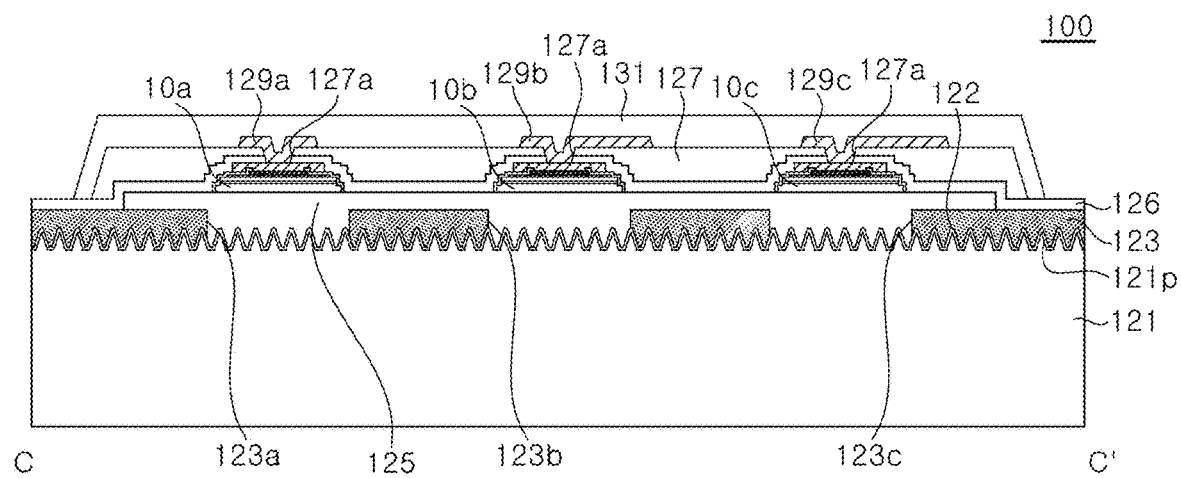
FIG. 4C is a schematic cross-sectional view taken along line C-C' of FIG. 4A.

FIG. 4A is a schematic plan view illustrating a unit pixel 100 according to an exemplary embodiment, FIG. 4B is a schematic cross-sectional view taken along line B-B' of FIG. 4A, and FIG. 4C is a schematic cross-sectional view taken along line C-C' of FIG. 4A.

Referring to FIG. 4A, FIG. 4B, and FIG. 4C, the unit pixel 100 may include a transparent substrate 121, a first, a second, and a third light emitting devices 10a, 10b, and 10c, a surface layer 122, a light blocking layer 123, an adhesive layer 125, a step adjustment layer 127, connection layers 129a, 129b, 129c, and 129d, and an insulation material layer 131

The unit pixel 100 provides a single pixel including the first, second, and third light emitting devices 10a, 10b, and 10c. The first, second, and third light emitting devices 10a, 10b, and 10c emit light of different colors, and the first, second, and third light emitting devices 10a, 10b, and 10c correspond to subpixels, respectively.

The transparent substrate 121 is a light transmissive substrate such as PET, glass substrate, quartz, sapphire substrate, or the like. The transparent substrate 121 is disposed on a light exiting surface of the displaying apparatus 10000 of FIG. 1, and light emitted from the light emitting devices 10a, 10b, and 10c is emitted to the outside through the transparent substrate 121. The transparent substrate 121 may have an upper surface and a lower surface. The transparent substrate 121 may include a concave-convex pattern 121p on a surface facing the light emitting devices 10a, 10b, and 10c, that is, the upper surface. The concave-convex pattern 121p scatters light emitted from the light emitting devices 10a, 10b, and 10c to increase a viewing angle. In addition, light emitted from the light emitting devices 10a, 10b, and 10c having different viewing angle characteristics from one another may be emitted at a uniform viewing angle by the concave-convex pattern 121p. As such, it is possible to prevent an occurrence of color difference depending on the viewing angle.

The concavo-convex pattern 121p may be regular or irregular. The concavo-convex pattern 121p may have a pitch of about 3 μm, a diameter of about 2.8 μm, and a height of about 1.8 μm, for example. The concavo-convex pattern 121p may be a pattern generally applied to a patterned sapphire substrate, but the inventive concepts are not limited thereto.

The transparent substrate 121 may also include an anti-reflection coating, may include an anti-glare layer, or may be treated with an anti-glare treatment. The transparent substrate 121 may have a thickness of about 50 μm to about 300 μm for example.

Since the transparent substrate 121 is disposed on the light exiting surface, the transparent substrate 121 does not include a circuit. However, the inventive concepts are not limited thereto, and, in some exemplary embodiments, the transparent substrate 121 may include the circuit.

Although a single unit pixel 100 is illustrated to be formed on a single transparent substrate 121, a plurality of unit pixels 100 may be formed on the single transparent substrate 121.

The surface layer 122 covers the concave-convex pattern 121p of the transparent substrate 121. The surface layer 122 may be formed along a shape of the concave-convex pattern 121p. The surface layer 122 may improve adhesion of the light blocking layer 123 formed thereon. For example, the surface layer 122 may be formed of a silicon oxide film. The surface layer 122 may be omitted depending on a type of the transparent substrate 121.

The light blocking layer 123 is formed on the upper surface of the transparent substrate 121. The light blocking layer 123 may contact the surface layer 122. The light blocking layer 123 may include an absorbing material which absorbs light such as carbon black. The light absorbing material may prevent light generated in the light emitting devices 10a, 10b, and 10c from leaking from a region between the transparent substrate 121 and the light emitting devices 10a, 10b, and 10c toward a side surface thereof, and may improve contrast of the displaying apparatus.

The light blocking layer 123 may have windows 123a, 123b, and 123c for a light path, so that light generated in the light emitting devices 10a, 10b, and 10c is incident on the transparent substrate 121, and for this purpose, the light blocking layer 123 may be patterned to expose the transparent substrate 121. Widths of the windows 123a, 123b, and 123c may be narrower than those of the light emitting devices, but the inventive concepts are not limited thereto. For example, the widths of the windows 123a, 123b, and 123c may be larger than those of the light emitting devices 10a, 10b, and 10c, and accordingly, a gap between the light emitting devices 10a and the light blocking layer 123 may be formed.

The adhesive layer 125 is attached onto the transparent substrate 121. The adhesive layer 125 may cover the light blocking layer 123. The adhesive layer 125 may be attached onto an entire surface of the transparent substrate 121, but the inventive concepts are not limited thereto, and, in some exemplary embodiments, the adhesive layer 125 may be attached to a portion of the transparent substrate 121 to expose a region near an edge of the transparent substrate 121. The adhesive layer 125 is used to attach the light emitting devices 10a, 10b, and 10c to the transparent substrate 121. The adhesive layer 125 may fill the windows 123a, 123b, and 123c formed in the light blocking layer 123.

The adhesive layer 125 may be formed as a light-transmitting layer, and transmits light emitted from the light emitting devices 10a, 10b, and 10c. The adhesive layer 125 may be formed using an organic adhesive. For example, the adhesive layer 125 may be formed using a transparent epoxy. In addition, the adhesive layer 125 may include a diffuser such as $SiO_2$, $TiO_2$, ZnO, or the like to diffuse light. The light diffusing material prevents the light emitting devices 10a, 10b and 10c from being observed from the light exiting surface.

The adhesive layer 125 has a smaller area than that of the transparent substrate 121. Further, the adhesive layer 125 may have a smaller area than that of the light blocking layer 123. The adhesive layer 123 is disposed inside a region surrounded by an edge of the transparent substrate 121. The light blocking layer 123 may be exposed around the adhesive layer 125.

The first, second, and third light emitting devices 10a, 10b, and 10c are disposed on the transparent substrate 121. The first, second, and third light emitting devices 10a, 10b, and 10c may be attached to the transparent substrate 121 by the adhesive layer 125. The first, second, and third light emitting devices 10a, 10b, and 10c may be disposed to correspond to the windows 123a, 123b, and 123c of the light blocking layer 123.

The first, second, and third light emitting devices 10a, 10b, and 10c may be disposed on a flat surface of the adhesive layer 125 as illustrated in FIG. 4B and FIG. 4C. The adhesive layer 125 may be disposed under lower surfaces of the light emitting devices 10a, 10b, and 10c. In another exemplary embodiment, the adhesive layer 125 may partially cover side surfaces of the first, second, and third light emitting devices 10a, 10b, and 10c.

The first, second, and third light emitting devices 10a, 10b, and 10c may be, for example, a red light emitting device, a green light emitting device, and a blue light emitting device. Since specific configurations of each of the first, second, and third light emitting devices 10a, 10b, and 10c are the same as those described with reference to FIG. 3A and FIG. 3B, detailed descriptions thereof will be omitted.

The first, second, and third light emitting devices 10a, 10b, and 10c may be arranged in a line, as illustrated in FIG. 4A. In particular, in a case that the transparent substrate 121 is a sapphire substrate, the sapphire substrate may include clean-cut surfaces (e.g., m-plane) and non-clean-cut surfaces (e.g., a-plane) due to a location of a crystal plane along a cutting direction. For example, when the sapphire substrate is cut into a quadrangular shape, two cutting planes on both sides thereof (e.g., m-plane) may be cut cleanly along the crystal plane, and two remaining cutting planes (e.g., a-plane) disposed in a direction perpendicular to the cutting planes may not be cut cleanly. In this case, the clean-cut surfaces of the sapphire substrate 121 may be flush with an arrangement direction of the light emitting devices 10a, 10b, and 10c. For example, in FIG. 4A, the clean-cut surfaces (e.g., m-plane) may be disposed up and down, and the two remaining cut surfaces (e.g., a-plane) may be disposed left and right.

In addition, each of the first, second, and third light emitting devices 10a, 10b, and 10c may be arranged parallel to one another in a long axis direction. Short axis directions of the first, second, and third light emitting devices 10a, 10b, and 10c may coincide with arrangement directions of these light emitting devices.

The first, second, and third light emitting devices 10a, 10b, and 10c may be those described above with reference to FIG. 3A and FIG. 3B, but the inventive concepts are not limited thereto, and various light emitting devices having a lateral or flip chip structure may be used.

A protection insulation layer 126 covers the adhesive layer 125 and the light emitting devices 10a, 10b, and 10c. In particular, the protection insulation layer 126 may cover a side surface of the adhesive layer 125, and may cover the light blocking layer 123 exposed around the adhesive layer 125. The protection insulation layer 126 may have openings exposing the light emitting devices 10a, 10b, and 10c. The protection insulation layer 126 is for preventing moisture, which may be formed of an inorganic insulation layer such as SiOx, SiN$_x$, Al$_2$O$_3$, or an organic material layer such as a high-density polymer, and also formed in a multilayer structure such as a distributed Bragg reflector (DBR). In an exemplary embodiment, side surfaces of the protection insulation layer 126, the light blocking layer 123, and the transparent substrate 121 may be in flush with one another.

The step adjustment layer 127 covers the first, second, and third light emitting devices 10a, 10b, and 10c and the adhesive layer 125. The step adjustment layer 127 may be formed on the protection insulation layer 126. The step adjustment layer 127 and the protection insulation layer 126 have openings 127a exposing the first and second electrode pads 61 and 63 of the light emitting devices 10a, 10b, and 10c. The step adjustment layer 127 assists to safely form the connection layers by uniformly adjusting elevations of surfaces on which the connection layers 129a, 129b, 129c, and 129d are formed. The step adjustment layer 127 may be formed of, for example, photosensitive polyimide.

The step adjustment layer 127 may have a larger area than that of the adhesive layer 125, and may cover a side surface of the adhesive layer 125. The step adjustment layer 127 may be disposed in a region surrounded by an edge of the transparent substrate 121, but the inventive concepts are not limited thereto. The adhesive layer 125 may be sealed by the protection insulation layer 126 or the step adjustment layer 127. Accordingly, it is possible to prevent the adhesive layer 125 from being exposed to the outside and/or being deformed by moisture or the like. Moreover, since the protection insulation layer 126 resistant to moisture is employed, the adhesive layer 125 may be further protected.

A side surface of the step adjustment layer 127 may be inclined at an angle of 90 degrees or less with respect to an upper surface of the adhesive layer 125. For example, the side surface of the step adjustment layer 127 may have an inclination angle of about 60 degrees with respect to the upper surface of the adhesive layer 125.

As shown in FIG. 4A, FIG. 4B, and FIG. 4C, the protection insulation layer 126 may be exposed around the step adjustment layer 127. The light blocking layer 123 is covered with the protection insulation layer 126 and is not exposed. However, the inventive concepts are not limited thereto. For example, a portion of the protection insulation layer 126 may be removed to partially expose an upper surface of the light blocking layer 123. Moreover, the side surface of the step adjustment layer 127 may be in flush with the protection insulation layer 126, and the light blocking layer 123 may be exposed around the step adjustment layer 127.

The first, second, third, and fourth connection layers 129a, 129b, 129c, and 129d are formed on the step adjustment layer 127. The connection layers 129a, 129b, 129c, and 129d may be connected to the first and second electrode pads 61 and 63 (shown in FIGS. 3A and 3B) of the first, second, and third light emitting devices 10a, 10b, and 10c through the openings 127a of the step adjustment layer 127 and the protection insulation layer 126.

In an exemplary embodiment, as illustrated in FIG. 4A and FIG. 4B, the first connection layer 129a may be electrically connected to a second conductivity type semiconductor layer of the first light emitting device 10a, the second connection layer 129b may be electrically connected to a second conductivity of the second light emitting device 10b, the third connection layer 129c may be electrically connected to a second conductivity type semiconductor layer of the third light emitting device 10c, and the fourth connection layer 129d may be commonly electrically connected to first conductivity type semiconductor layers of the first, second, and third light emitting devices 10a, 10b, and 10c. The first, second, third, and fourth connection layers 129a, 129b, 129c, and 129d may be formed together on the step adjustment layer 127, and may include, for example, Au.

In another exemplary embodiment, the first connection layer 129a may be electrically connected to the first conductivity type semiconductor layer of the first light emitting device 10a, the second connection layer 129b may be electrically connected to the first conductivity type semiconductor layer of the second light emitting device 10b, the third connection layer 129c may be electrically connected to the first conductivity type semiconductor layer of the third light emitting device 10c, and the fourth connection layer 129d may be commonly electrically connected to the second conductivity type semiconductor layers of the first, second, and third light emitting devices 10a, 10b, and 10c. The first, second, third, and fourth connection layers 129a, 129b, 129c, and 129d may be formed together on the step adjustment layer 127.

The insulation material layer 131 may be formed to have a thickness smaller than that of the step adjustment layer 127. A sum of the thicknesses of the insulation material layer 131 and the step adjustment layer 127 may be about 1 μm or more and 50 μm or less, but the inventive concepts are not limited thereto. Meanwhile, a side surface of the insulation material layer 131 may have an inclination angle of 90 degrees or less, for example, about 60 degrees with respect to the upper surface of the adhesive layer 125.

The insulation material layer 131 covers side surfaces of the step adjustment layer 127 and the connection layers 129a, 129b, 129c, and 129d. In addition, the insulation material layer 131 may cover a portion of the protection insulation layer 126. The insulation material layer 131 may have openings 131a, 131b, 131c, and 131d exposing the connection layers 129a, 129b, 129c, and 129d, and accordingly, pad regions of the unit pixel 100 may be defined.

In an exemplary embodiment, the insulation material layer 131 may be a translucent material, and may be formed of an organic or inorganic material. The insulation material layer 131 may be formed of, for example, polyimide. When the insulation material layer 131 along with the step adjustment layer 127 is formed of polyimide, all of lower, side, and upper surfaces of the connection layers 129a, 129b, 129c, and 129d may be surrounded by the polyimide, except for the pad regions.

Meanwhile, the unit pixel 100 may be mounted on a circuit board using a bonding material such as solder, and the bonding material may bond the connection layers 129a, 129b, 129c, and 129d exposed to the openings 131a, 131b, 131c, and 131d of the insulation material layer 131 to pads on the circuit board.

According to the illustrated exemplary embodiment, the unit pixel 100 does not include separate bumps, and the connection layers 129a, 129b, 129c, and 129d are used as bonding pads. However, the inventive concepts are not limited thereto, and bonding pads covering the openings 131a, 131b, 131c, and 131d of the insulation material layer 131 may be formed. In an exemplary embodiment, the bonding pads may be formed to partially cover the light emitting devices 10a, 10b, and 10c outside of upper regions of the first, second, third, and fourth connection layers 129a, 129b, 129c, and 129d.

FIGS. 5A through 5F are schematic cross-sectional views illustrating a method of fabricating a unit pixel 100 according to an exemplary embodiment.

Figure 5A:
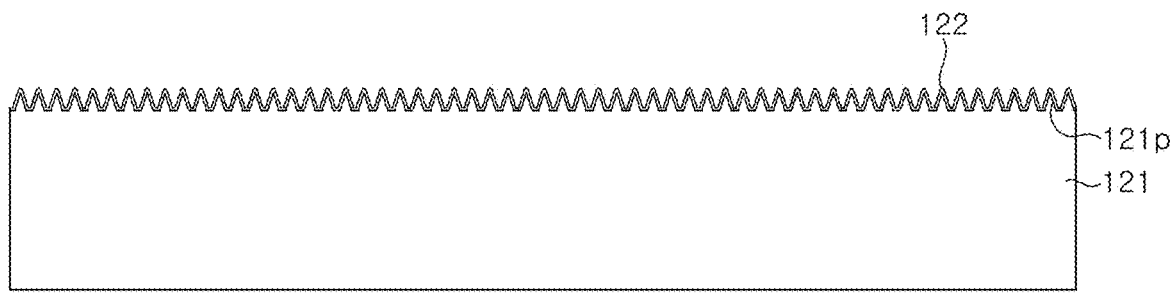
FIGS. 5A through 5F are schematic cross-sectional views illustrating a method of fabricating a unit pixel according to an exemplary embodiment, where.

First, Referring to FIG. 5A, a concave-convex pattern 121p is formed on an upper surface of a transparent substrate 121. The transparent substrate 121 is a light-transmitting substrate such as PET, glass substrate, quartz, sapphire substrate, or the like. In an exemplary embodiment, the concave-convex pattern 121p may be formed by etching the surface of the transparent substrate 121 using a dry or wet etching technique.

A surface layer 122 may be formed on the transparent substrate 121. The surface layer 122 may be formed along the concave-convex pattern 121p. The surface layer 122 may be formed of, for example, a silicon oxide film. The surface layer 122 is formed to modify the surface of the transparent substrate 121, and may be omitted.

Figure 5B:
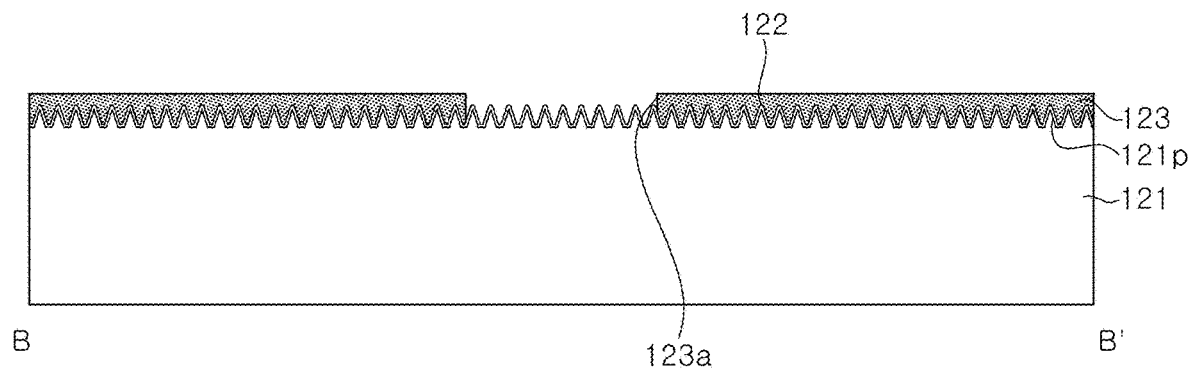

Referring to FIG. 4A and FIG. 5B, a light blocking layer 123 is formed on the transparent substrate 121. The light blocking layer 123 may be formed of a light-absorbing material layer, for example, a black matrix including a light-absorbing material such as carbon black. The light blocking layer 123 may also be formed of a photosensitive material layer and patterned through exposure and development techniques. Windows 123a, 123b, and 123c may be formed by patterning the light blocking layer 123. A plurality of windows 123a, 123b, and 123c may be formed corresponding to light emitting devices 10a, 10b, and 10c, and these windows 123a, 123b, and 123c may be spaced apart from one another.

Figure 5C:
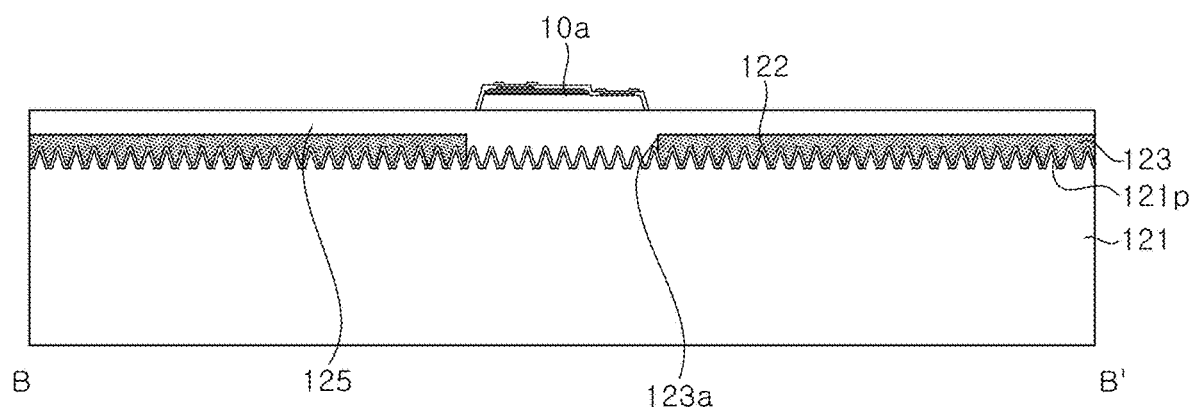

Referring to FIG. 4A and FIG. 5C, an adhesive layer 125 may be formed on the light blocking layer 123. The adhesive layer 125 may cover the light blocking layer 123, and may also cover the surface layer 122 or the transparent substrate 121 exposed through the windows 123a, 123b, and 123c formed on the light blocking layer 123.

The adhesive layer 125 may be formed on an entire surface of the transparent substrate 121, but the inventive concepts are not limited thereto, and may be formed in a portion of the transparent substrate 121 to expose a region near an edge of the transparent substrate 121. The adhesive layer 125 is used to attach the light emitting devices 10a, 10b, and 10c to the transparent substrate 121. The adhesive layer 125 may be formed as a light-transmitting layer, and transmits light emitted from the light emitting devices 10a, 10b, and 10c. The adhesive layer 125 may be formed using an adhesive sheet or an organic adhesive. For example, the adhesive layer 125 may be formed using a transparent epoxy. In an exemplary embodiment, the adhesive layer 125 may include a diffuser such as $SiO_2$, $TiO_2$, ZnO, or the like to diffuse light. The light diffusing material prevents the light emitting devices 10a, 10b, and 10c from being observed from a light exiting surface.

Subsequently, the light emitting devices 10a, 10b, and 10c are disposed on the adhesive layer 125. The light emitting devices 10a, 10b, and 10c may be transferred to the adhesive layer 125 together using a transferring process. The light emitting devices 10a, 10b, and 10c may be disposed correspondingly to the windows 123a, 123b, and 123c, respectively. The light emitting devices 10a, 10b, and 10c may have a size smaller than those of the windows 123a, 123b, and 123c and may be located within upper regions of the windows 123a, 123b, and 123c. In another exemplary embodiment, the light emitting devices 10a, 10b, and 10c may have an area larger than those of the windows 123a, 123b, and 123c.

Figure 5D:
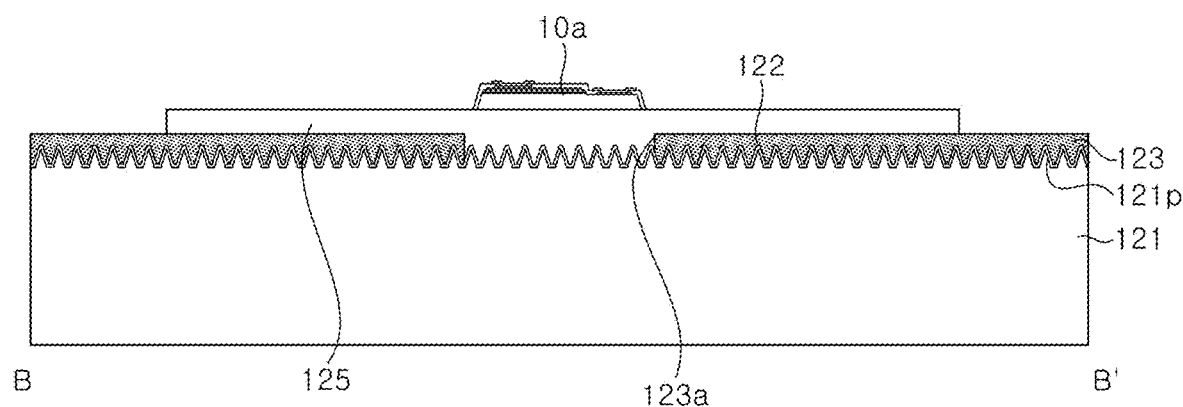

Referring to FIG. 4A and FIG. 5D, the adhesive layer 125 may be selectively removed to expose the light blocking layer 123 around the adhesive layer 125. The adhesive layer 125 may be selectively removed using various known techniques available in the art. A process of selectively removing the adhesive layer 125 may be carried out before the light emitting devices 10a, 10b, and 10c are attached.

Figure 5E:
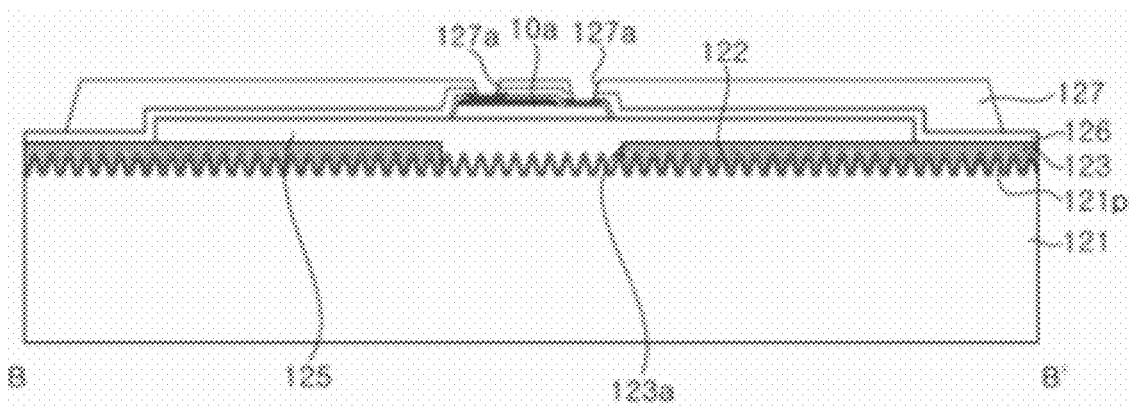

Referring to FIG. 4A and FIG. 5E, a protection insulation layer 126 and a step adjustment layer 127 are formed to cover the light emitting devices 10a, 10b, and 10c. The protection insulation layer 126 may be formed of an inorganic insulation layer or a high-density polymer to block moisture. The step adjustment layer 127 may be formed of, for example, photosensitive polyimide, and may be patterned using exposure and development techniques.

For example, the protection insulation layer 126 and the step adjustment layer 127 may be patterned to have openings 127a exposing the light emitting devices 10a, 10b, and 10c. For example, the openings 127a of the protection insulation layer 126 and the step adjustment layer 127 may expose first and second electrode pads (61 and 63 of FIG. 3B) of the light emitting devices 10a, 10b, and 10c. Further, the step adjustment layer 127 may be removed along the edge of the transparent substrate 121 to expose the protection insulation layer 126. In addition, the protection insulation layer 126 along with the step adjustment layer 127 may also be removed along the edge of the transparent substrate 121 to expose the light blocking layer 123. The step adjustment layer 127 and the protection insulation layer 126 are removed together and a side surface of the step adjustment layer 127 and a side surface of the protection insulation layer 126 may be in flush with each other, but the inventive concepts are not limited thereto.

Figure 5F:
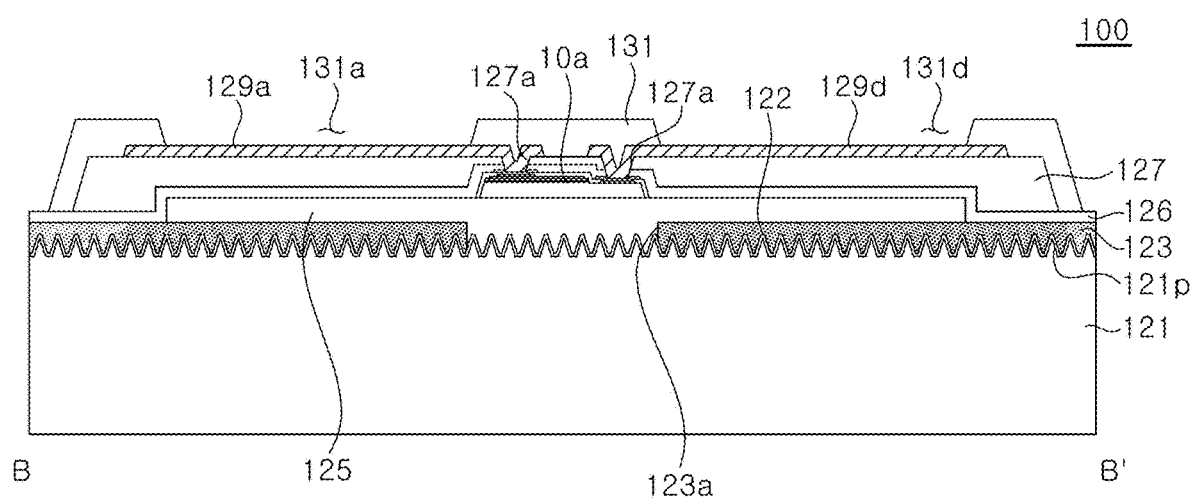

Referring to FIG. 4A and FIG. 5F, first, second, third, and fourth connection layers 129a, 129b, 129c, and 129d are formed on the step adjustment layer 127. For example, the first, second, third, and fourth connection layers 129a, 129b, 129c, and 129d may be formed using a lift-off technique.

The first, second, third, and fourth connection layers 129a, 129b, 129c, and 129d may be electrically connected to the light emitting devices 10a, 10b, and 10c through the openings 127a of the protection insulation layer 126 and the step adjustment layer 127. For example, the first, second, and third connection layers 129a, 129b, and 129c may be electrically connected to first conductivity type semiconductor layers of the light emitting devices 10a, 10b, and 10c, respectively, and the fourth connection layer 129d may be commonly electrically connected second conductivity type semiconductor layers of the light emitting devices 10a, 10b, and 10c.

Subsequently, an insulation material layer 131 may be formed. The insulation material layer 131 covers the first, second, third, and fourth connection layers 129a, 129b, 129c, and 129d. As shown in FIG. 4A, the insulation material layer 131 may have openings 131a, 131b, 131c, and 131d exposing the first, second, third, and fourth connection layers 129a, 129b, 129c, and 129d, and a pad region may be defined by these openings 131a 131b, 131c, and 131d.

According to the illustrated exemplary embodiments, since the adhesive layer 125 is sealed by the protection insulation layer 126 or the step adjustment layer 127, it is possible to prevent the adhesive layer 125 from being damaged by moisture.

Figure 6A:
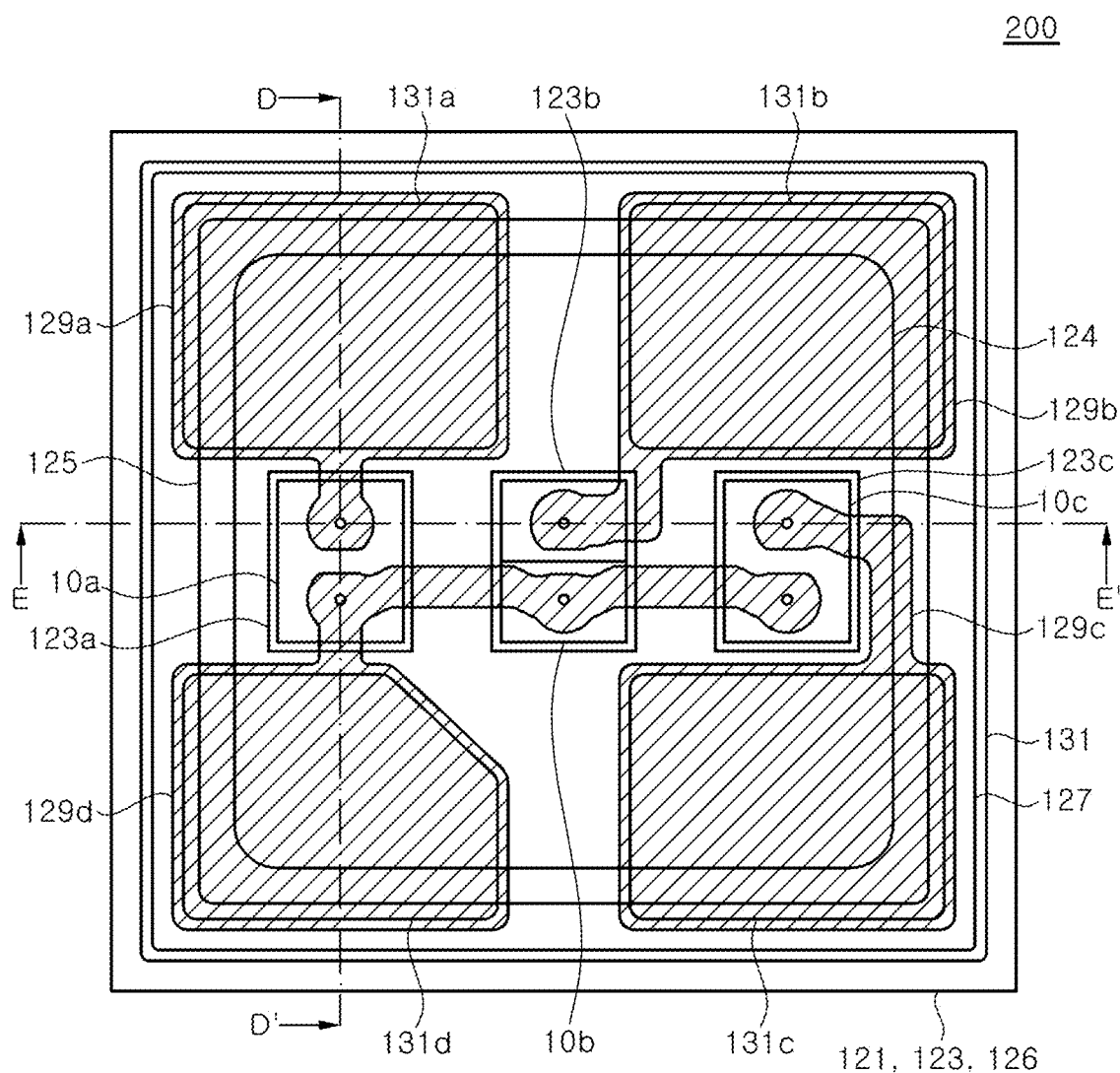
FIG. 6A is a schematic plan view illustrating a unit pixel according to another exemplary embodiment.
Figure 6B:
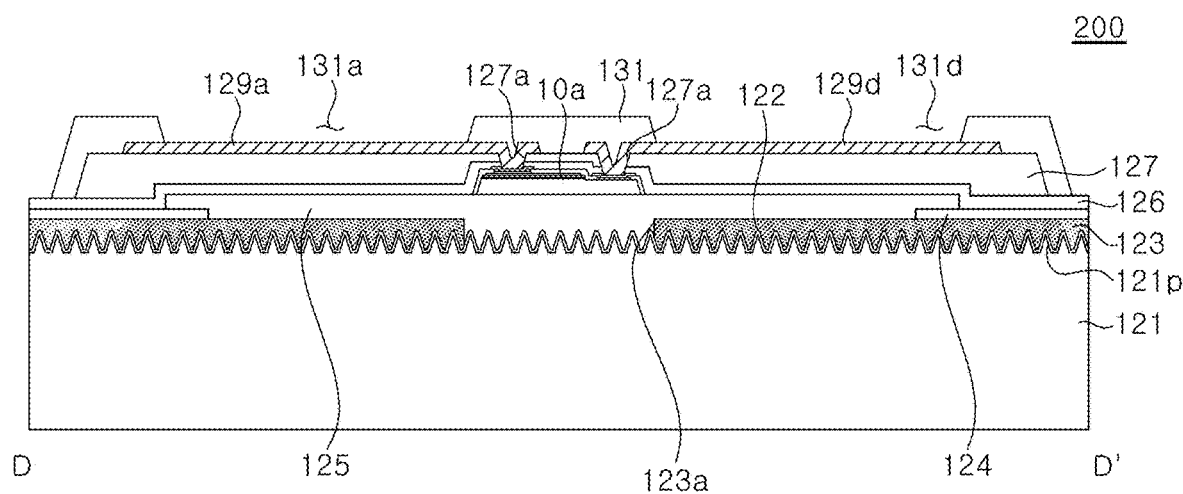
FIG. 6B is a schematic cross-sectional view taken along line D-D' of FIG. 6A.
Figure 6C:
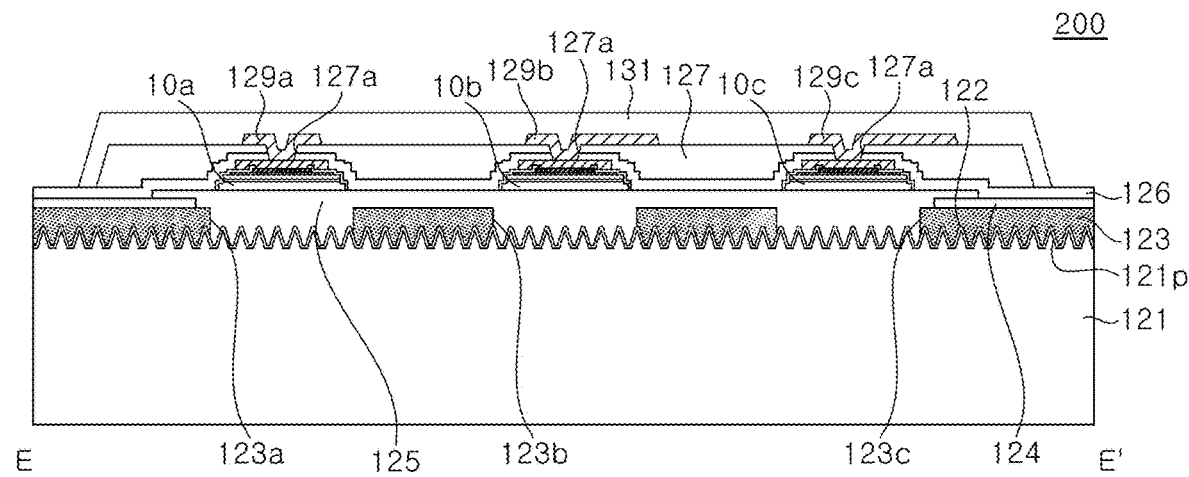
FIG. 6C is a schematic cross-sectional view taken along line E-E' of FIG. 6A.

FIG. 6A is a schematic plan view illustrating a unit pixel 200 according to another exemplary embodiment, FIG. 6B is a schematic cross-sectional view taken along line D-D' of FIG. 6A, and FIG. 6C is a schematic cross-sectional view taken along line E-E' of FIG. 6A.

Referring to FIG. 6A, FIG. 6B, and FIG. 6C, the unit pixel 200 according to the exemplary embodiment is substantially similar to the unit pixel 100 described with reference to FIG.

4A, FIG. 4B, and FIG. 4C, but an etching stop layer 124 is further included in the unit pixel 200.

The etching stop layer 124 is disposed between an adhesive layer 125 and a light blocking layer 123, and is exposed around the adhesive layer 125. The etching stop layer 124 prevents the light blocking layer 123 from being exposed around the adhesive layer 125. For example, when the adhesive layer 125 is selectively removed using an etching technique, the etching stop layer 124 may prevent the light blocking layer 123 from being etched and damaged. The etching stop layer 124 may be formed in a ring shape along an edge of a transparent substrate 121, and windows 123a, 123b, and 123c may be located in a region surrounded by the etching stop layer 124. The etching stop layer 124 may be formed of a metal or an organic/inorganic insulation layer.

An upper surface of the etching stop layer 124 exposed around the adhesive layer 125 may be covered with a protection insulation layer 126. A side surfaces of the etching stop layer 124 may be in flush with side surfaces of the transparent substrate 121, the light blocking layer 123, and the protection insulation layer 126.

FIGS. 7A through 7F are schematic cross-sectional views illustrating a method of fabricating a unit pixel 200 according to an exemplary embodiment.

Figure 7A:
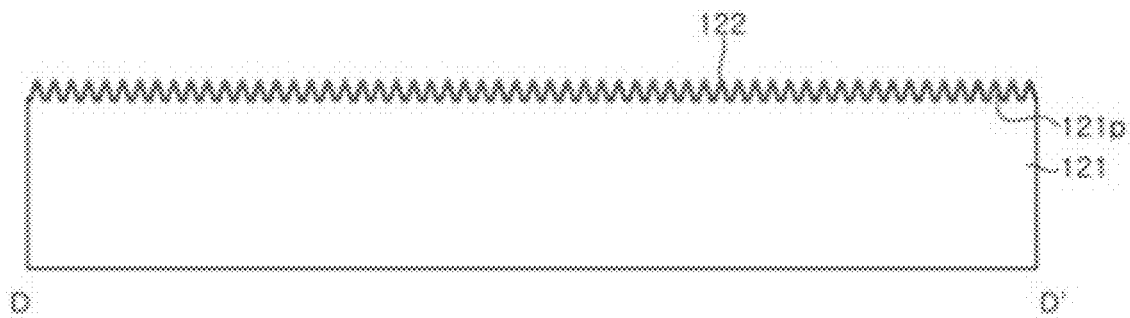
FIGS. 7A through 7F are schematic cross-sectional views illustrating a method of fabricating a unit pixel according to an exemplary embodiment, where.
Figure 7B:
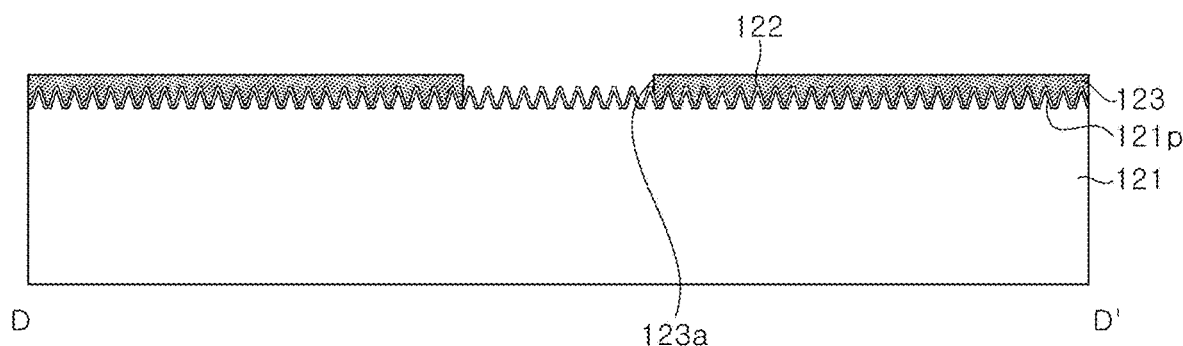

FIG. 7A and FIG. 7B illustrate a process of forming the concave-convex pattern 121p on the upper surface of the transparent substrate 121 and the light blocking layer 123 on the transparent substrate 121, and since they are the same as FIG. 5A and FIG. 5B, redundant descriptions thereof will be omitted.

Figure 7C:
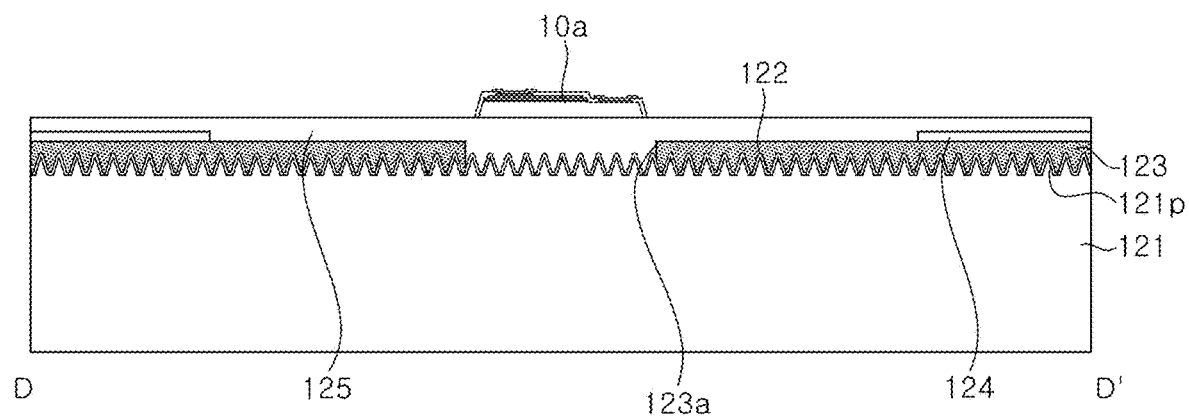

Referring to FIG. 6A and FIG. 7C, an etching stop layer 124 is formed in a region surrounding windows 123a, 123b, and 123c of a light blocking layer 123. The etching stop layer 124 may be formed in a ring shape, and the windows 123a, 123b, and 123c are disposed in a region surrounded by the etching stop layer 124.

Thereafter, an adhesive layer 125 is formed on the etching stop layer 124 and the light blocking layer 123. The adhesive layer 125 may cover the etching stop layer 124. Subsequently, light emitting devices 10a, 10b, and 10c are formed on the adhesive layer 125.

Figure 7D:
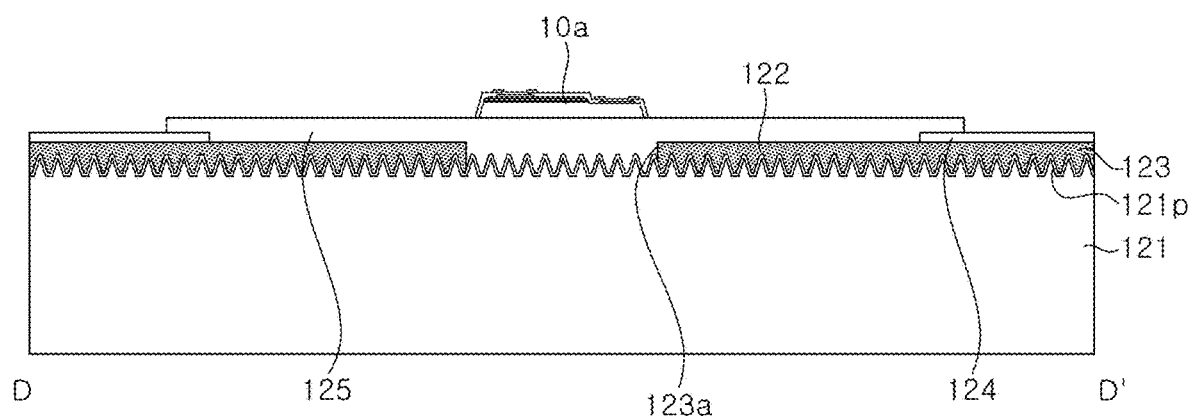

Referring to FIG. 6A and FIG. 7D, the adhesive layer 125 is selectively removed. The adhesive layer 125 may be selectively removed before the light emitting devices 10a, 10b, and 10c are attached.

The adhesive layer 125 may be removed using, for example, an etching technique, and the adhesive layer 125 on the etching stop layer 124 may be partially removed. Accordingly, the remaining adhesive layer 125 covers the etching stop layer 124 and also covers the region surrounded by the etching stop layer 124. Meanwhile, the etching stop layer 124 is exposed around the adhesive layer 125. The etching stop layer 124 may protect the light blocking layer 123 by preventing the light blocking layer 123 from being exposed while the adhesive layer 125 is selectively removed.

Figure 7E:
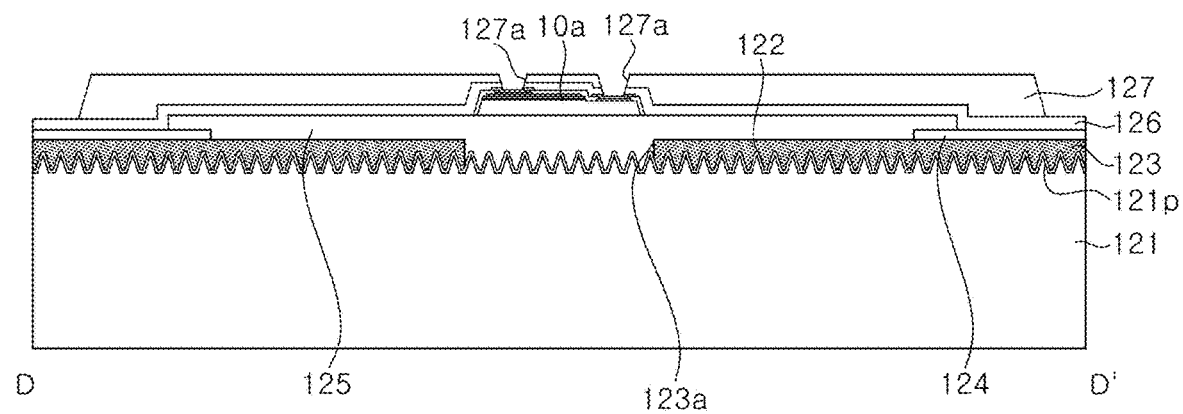

Referring to FIG. 6A and FIG. 7E, a protection insulation layer 126 covering the adhesive layer 125 and the light emitting devices 10a, 10b, and 10c is formed. The protection insulation layer 126 may cover the etching stop layer 124 exposed around the adhesive layer 125. Subsequently, a step adjustment layer 127 is formed. In addition, the protection insulation layer 126 and the step adjustment layer 127 may be patterned to have openings 127a exposing the light emitting devices 10a, 10b, and 10c. Further, the step adjustment layer 127 may be removed along an edge of the transparent substrate 121 to expose the protection insulation layer 126. In addition, the protection insulation layer 126 may be removed along the edge of the transparent substrate 121 to expose the etching stop layer 124 or the light blocking layer 123 around the step adjustment layer 127.

Figure 7F:
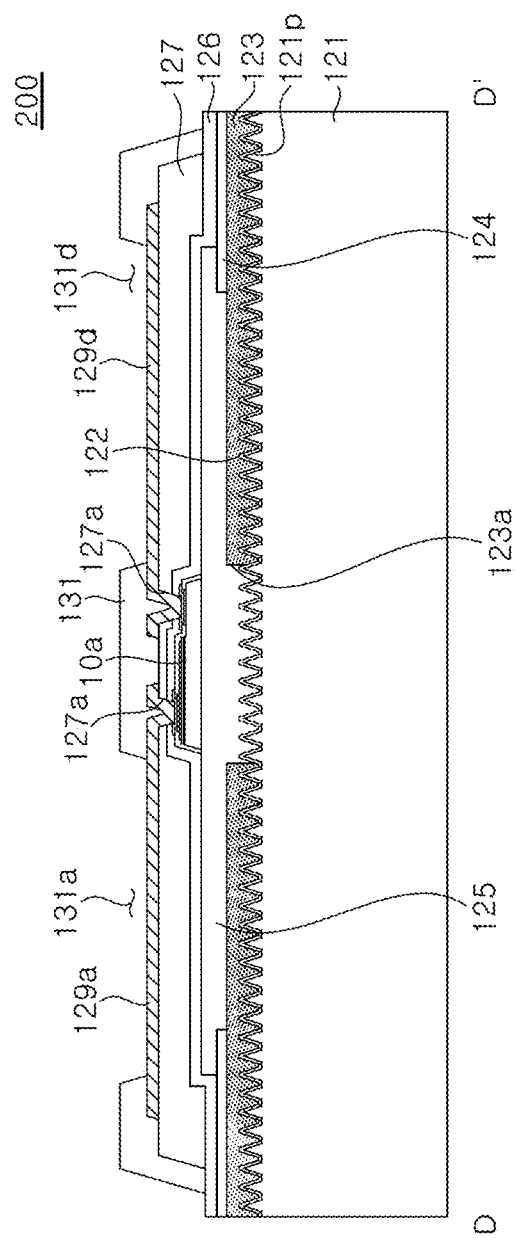

Referring to FIG. 6A and FIG. 7F, first, second, third, and fourth connection layers 129a, 129b, 129c, and 129d may be formed on the step adjustment layer 127, and an insulation material layer 131 may be formed on the first, second, third, and fourth connection layers 129a, 129b, 129c, and 129d. The first, second, third, and fourth connection layers 129a, 129b, 129c, and 129d and the insulation material layer 131 are the same as those described with reference to FIG. 5F, detailed descriptions thereof will be omitted to avoid redundancy.

According to the present disclosure, the adhesive layer 125 may be sealed to protect from moisture, etc., and further, when the adhesive layer 125 is selectively removed by employing the etching stop layer 124, the light blocking layer 123 may be prevented from being damaged.

Although some exemplary embodiments have been described herein, it should be understood that these exemplary embodiments are provided for illustration only and are not to be construed in any way as limiting the present disclosure. It should be understood that features or components of one exemplary embodiment can also be applied to other exemplary embodiments without departing from the spirit and scope of the present disclosure.

What is claimed is:

1. A unit pixel, comprising:
   a substrate;
   a plurality of light emitting devices disposed on the substrate;
   an adhesive layer disposed between the plurality of light emitting devices and the substrate and bonding the plurality of light emitting devices to the substrate; and
   a moisture barrier structure configured to block an exposure of an outer region of the adhesive layer such that the adhesive layer is prevented from moisture damage, the moisture barrier structure further comprising:
   a first structure comprising an insulating layer covering the adhesive layer;
   a second structure disposed on the first structure and having a step adjustment layer;
   covering the adhesive layer and the plurality of light emitting devices;
   wherein the unit pixel further comprises:
   plurality of connection layers disposed on the step adjustment layer and corresponding to the plurality of light emitting devices;
   an insulation material layer covering the plurality of connection layers,
   wherein the adhesive layer has a smaller area than an area of the substrate, and
   wherein the insulation material layer covers side surfaces of the step adjustment layer along with side surfaces of the plurality of connection layers.

2. The unit pixel of claim 1,
   wherein the insulation material layer has a thickness smaller than that of the step adjustment layer.

3. The unit pixel of claim 1, wherein:
   the first structure further comprises a protection insulation layer disposed between the second structure and the adhesive layer; and
   the protection insulation layer covers an upper surface and a side surface of the adhesive layer.

4. The unit pixel of claim 3, wherein:
the step adjustment layer covers the adhesive layer and the plurality of light emitting devices; and
the step adjustment layer further covers the side surface of the adhesive layer.

5. The unit pixel of claim 4, wherein:
the protection insulation layer covers the plurality of light emitting devices, and
the step adjustment layer and the protection insulation layer have openings exposing the plurality of light emitting devices.

6. The unit pixel of claim 5,
wherein each of the plurality of connection layers is electrically connected to a corresponding light emitting device through the openings of the step adjustment layer and the protection insulation layer.

7. The unit pixel of claim 6,
wherein the insulation material layer has a plurality of openings exposing the plurality of connection layers.

8. A unit pixel, comprising:
a substrate;
a plurality of light emitting devices disposed on the substrate;
an adhesive layer disposed between at least one of the plurality of light emitting devices and the substrate and configured to bond the plurality of light emitting devices to the substrate;
a light blocking layer disposed between the substrate and the adhesive layer, wherein the light blocking layer has windows through which light generated from the plurality of light emitting devices passes, and the adhesive layer covers the windows; and
a protection structure configured to protect the adhesive layer, the protection structure further comprising:
  a first structure comprising an insulating layer that is resistant to moisture and covering the adhesive layer;
  a second structure covering a side of the first structure; and
  a third structure formed beneath the first structure,
wherein the adhesive layer has a smaller area than an area of the substrate.

9. The unit pixel of claim 8, wherein:
the third structure further comprises an etching stop layer disposed between the light blocking layer and the adhesive layer,
wherein the adhesive layer partially covers the etching stop layer to expose an edge of the etching stop layer.

10. The unit pixel of claim 9,
wherein the etching stop layer is formed in a ring shape along an edge of the substrate, and the windows are surrounded by the etching stop layer.

11. The unit pixel of claim 10, wherein:
the second structure further comprises a step adjustment layer covering the adhesive layer and the plurality of light emitting devices, and
the step adjustment layer covers side surfaces of the adhesive layer.

12. The unit pixel of claim 11, wherein:
the first structure further comprises a protection insulation layer disposed between the step adjustment layer and the adhesive layer,
the protection insulation layer covers an upper surface and the side surfaces of the adhesive layer.

13. The unit pixel of claim 12, wherein:
the protection insulation layer covers the plurality of light emitting devices, and
the step adjustment layer and the protection insulation layer have openings exposing the plurality of light emitting devices.

14. The unit pixel of claim 12,
wherein a side surface of the substrate is flush with side surfaces of the light blocking layer, the etching stop layer, and the protection insulation layer.

15. A displaying apparatus, comprising:
a circuit board; and
a plurality of unit pixels disposed on the circuit board,
each of the plurality of unit pixels comprising:
  a transparent substrate;
  a plurality of light emitting devices disposed on the transparent substrate; and
  an adhesive layer disposed between the plurality of light emitting devices and the transparent substrate to bond the plurality of light emitting devices,
  wherein the adhesive layer is sealed inside a unit pixel such that the adhesive layer is inaccessible by moisture;
  a step adjustment layer covering the adhesive layer and the plurality of light emitting devices; and
  a protection insulation layer disposed between the step adjustment layer and the adhesive layer,
  wherein the step adjustment layer and the protection insulation layer cover a side surface of the adhesive layer,
wherein each of the plurality of unit pixels further comprises:
  a light blocking layer disposed between the transparent substrate and the adhesive layer; and
  an etching stop layer disposed between the light blocking layer and the adhesive layer,
wherein:
  the light blocking layer has windows through which light generated from the plurality of light emitting devices passes,
  the adhesive layer covers the windows, and
  the adhesive layer partially covers the etching stop layer to expose an edge of the etching stop layer.

16. The displaying apparatus of claim 15,
wherein the etching stop layer is formed in a ring shape along an edge of the transparent substrate, and the windows are surrounded by the etching stop layer.

* * * * *